(12) United States Patent
Ahn et al.

(10) Patent No.: US 9,816,186 B2
(45) Date of Patent: Nov. 14, 2017

(54) NANO IMPRINTING WITH REUSABLE POLYMER TEMPLATE WITH METALLIC OR OXIDE COATING

(71) Applicant: Molecular Imprints, Inc., Austin, TX (US)

(72) Inventors: Se Hyun Ahn, Mountain View, CA (US); Byung-Jin Choi, Austin, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 14/922,953

(22) Filed: Oct. 26, 2015

(65) Prior Publication Data
US 2016/0047044 A1    Feb. 18, 2016

Related U.S. Application Data

(63) Continuation of application No. 14/216,017, filed on Mar. 17, 2014, now Pat. No. 9,170,485.
(Continued)

(51) Int. Cl.
*G03G 7/00* (2006.01)
*C23C 16/513* (2006.01)
(Continued)

(52) U.S. Cl.
CPC .............. *C23C 16/513* (2013.01); *B41C 1/10* (2013.01); *B82Y 10/00* (2013.01); *B82Y 40/00* (2013.01);
(Continued)

(58) Field of Classification Search
CPC .. G03F 7/0002; B29C 59/14; B29C 2059/145
(Continued)

(56) References Cited

U.S. PATENT DOCUMENTS

6,873,087 B1    3/2005   Choi et al.
6,932,934 B2    8/2005   Choi et al.
(Continued)

FOREIGN PATENT DOCUMENTS

CN    105143976 A1    12/2015
EP      2286980 A1     2/2011
(Continued)

OTHER PUBLICATIONS

Premkumar, P.A. et al., "Smooth and Self-Similar SiO2-like Films on Polymers Synthesized in Roll-to-Roll Atmospheric Pressure-PECVD for Gas Diffusion Barrier Applications", Plasma Process. Polym., 2010, issue 7, pp. 635-639.*
(Continued)

*Primary Examiner* — Alison L Hindenlang
*Assistant Examiner* — Lawrence D Hohenbrink, Jr.
(74) *Attorney, Agent, or Firm* — Fish & Richardson P.C.

(57) ABSTRACT

Methods and systems are provided for fabricating polymer-based imprint lithography templates having thin metallic or oxide coated patterning surfaces. Such templates show enhanced fluid spreading and filling (even in absence of purging gases), good release properties, and longevity of use. Methods and systems for fabricating oxide coated versions, in particular, can be performed under atmospheric pressure conditions, allowing for lower cost processing and enhanced throughput.

2 Claims, 8 Drawing Sheets

Related U.S. Application Data (60) Provisional application No. 61/792,280, filed on Mar. 15, 2013.

(51) Int. Cl.

| | | |
|---|---|---|
| *G03F 7/00* | (2006.01) | |
| *B82Y 10/00* | (2011.01) | |
| *B82Y 40/00* | (2011.01) | |
| *B41C 1/10* | (2006.01) | |
| *C23C 16/40* | (2006.01) | |
| *C23C 16/48* | (2006.01) | |
| *B29C 59/04* | (2006.01) | |
| *B29C 59/14* | (2006.01) | |

(52) U.S. Cl.
CPC ............ *C23C 16/402* (2013.01); *C23C 16/48* (2013.01); *G03F 7/0002* (2013.01); *B29C 59/043* (2013.01); *B29C 59/046* (2013.01); *B29C 59/14* (2013.01); *B29C 2059/145* (2013.01)

(58) Field of Classification Search
USPC ...... 425/385; 427/255.28, 255.37, 569, 579; 264/293, 446, 483
See application file for complete search history.

(56) References Cited

U.S. PATENT DOCUMENTS

| | | | |
|---|---|---|---|
| 6,936,194 B2 | 8/2005 | Watts | |
| 7,037,574 B2 | 5/2006 | Paranjpe et al. | |
| 7,077,992 B2 | 7/2006 | Sreenivasan et al. | |
| 7,157,036 B2 | 1/2007 | Choi et al. | |
| 7,179,396 B2 | 2/2007 | Sreenivasan | |
| 7,396,475 B2 | 7/2008 | Sreenivasan | |
| 7,819,652 B2 | 10/2010 | Lee et al. | |
| 7,976,762 B2 | 7/2011 | Stutzmann et al. | |
| 8,029,716 B2 | 10/2011 | Houle et al. | |
| 8,076,386 B2 | 12/2011 | Xu et al. | |
| 8,114,331 B2 | 2/2012 | Houle et al. | |
| 8,349,241 B2 | 1/2013 | Sreenivasan et al. | |
| 8,616,873 B2 | 12/2013 | Miller et al. | |
| 9,170,485 B2 | 10/2015 | Ahn et al. | |
| 2002/0135099 A1 | 9/2002 | Robinson et al. | |
| 2004/0065252 A1 | 4/2004 | Sreenivasan et al. | |
| 2005/0281951 A1* | 12/2005 | Amato-Wierda | ... C23C 16/4407 427/248.1 |
| 2008/0061214 A1 | 3/2008 | Lee et al. | |
| 2009/0046362 A1* | 2/2009 | Guo | ........ B82Y 40/00 359/485.05 |
| 2010/0078846 A1 | 4/2010 | Resnick et al. | |
| 2010/0104852 A1* | 4/2010 | Fletcher | ................ B82Y 10/00 428/315.5 |
| 2013/0214452 A1 | 8/2013 | Choi et al. | |
| 2014/0314897 A1 | 10/2014 | Ahn et al. | |

FOREIGN PATENT DOCUMENTS

| | | |
|---|---|---|
| EP | 2463073 A1 | 6/2012 |
| JP | 2016514903 A1 | 5/2016 |
| KR | 2015127092 A1 | 11/2015 |
| WO | WO2008150499 A1 | 12/2008 |
| WO | WO2014145634 A1 | 9/2014 |

OTHER PUBLICATIONS

Premkumar, P.A. et al., "High Quality SiO2-like Layers by Large Area Atmospheric Pressure Plasma enhanced CVD: Deposition Process Studies by Surface Analysis", Plasma Process. Polym., 2009, issue 6, pp. 693-702.*
International Search Report for International Application No. PCT/US2014030432, dated Nov. 5, 2014, 6 pages.
Written Opinion for International Application No. PCT/US2014030432, dated Nov. 5, 2014, 8 pages.

* cited by examiner

FIG. 1

--Prior Art--

FIG. 2

--Prior Art--

NANO IMPRINTING WITH REUSABLE POLYMER TEMPLATE WITH METALLIC OR OXIDE COATING

CROSS-REFERENCE TO RELATED APPLICATIONS

This application is a divisional of U.S. patent application Ser. No. 14/216,017 filed Mar. 17, 2014, which claims the benefit under 35 U.S.C. §119(e)(1) of U.S. Provisional No. 61/792,280 filed on Mar. 15, 2013; both of which are incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary nanoimprint lithography processes are described in detail in numerous publications, such as U.S. Pat. No. 8,349,241, U.S. Pat. No. 8,066,930, and U.S. Pat. No. 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
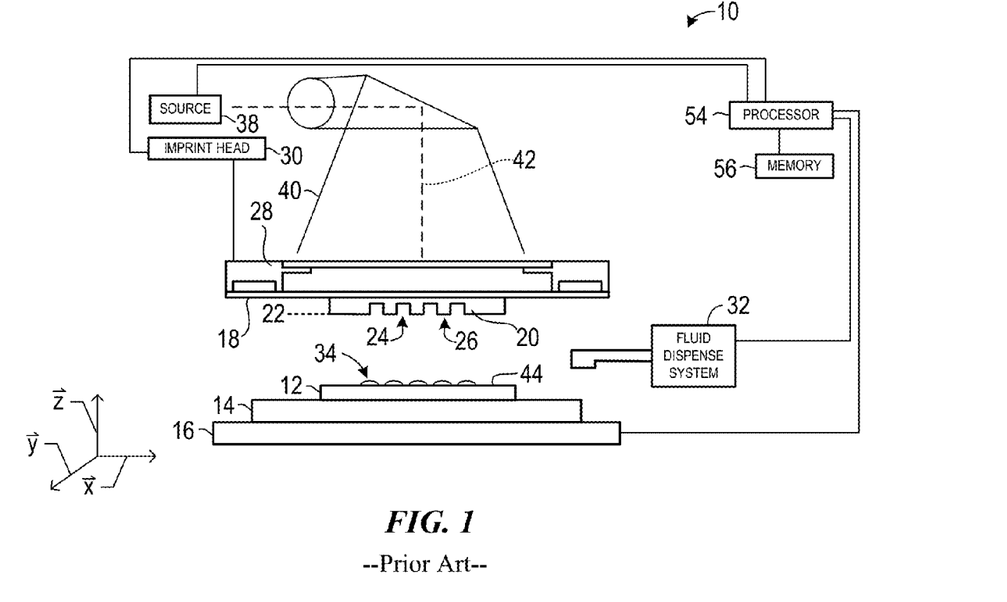
FIG. 1 illustrates a simplified side view of a nanoimprint lithography system having a template and a mold spaced apart from a substrate.

Referring to the figures, and particularly to FIG. 1, illustrated therein is a nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087. Further, chuck 28 may be coupled to imprint head 30 such that chuck 28 and/or imprint head 30 may be configured to facilitate movement of template 18.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Pat. No. 8,076,386, both of which are herein incorporated by reference. Alternatively, formable material 34 may include, but is not limited to, biomaterials (e.g., PEG), solar cell materials (e.g., N-type, P-type materials), and/or the like.

Figure 2:
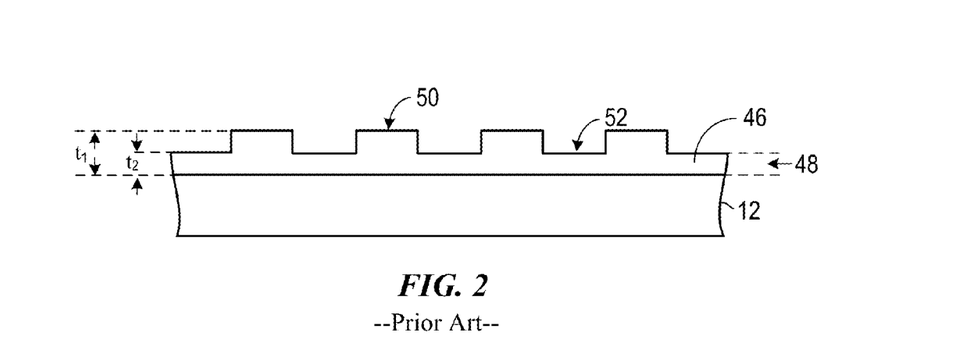
FIG. 2 illustrates a simplified view of the substrate illustrated in FIG. 1, having a patterned layer thereon.

Referring to FIGS. 1 and 2, nanoimprint lithography system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in nano imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Conventional glass, quartz or fused silica templates used in nanoimprint lithography are typically fabricated by e-beam processes, followed by multiple vacuum processes such as reactive ion etching (RIE). However, such processes are both expensive and time-consuming. Template replication processes are known that use lithography (e.g., nanoimprint lithography) to create replica templates in glass (or a similar substrate) using an e-beam fabricated master template. While less costly that direct e-beam fabrication, such glass template replication still requires RIE etching to transfer pattern features into the glass, followed by SEM inspection in order to finalize and confirm feature geometry. These processes are still time-intensive, and can cause a bottleneck in high-throughput nanoimprint lithography manufacturing processes. Polymer templates, i.e., templates where the patterning surface of the template is itself formed of a polymeric material (e.g. via lithography processes), can be fabricated more quickly and less expensively than glass templates, but they likewise have disadvantages. For example, such polymer templates generally do not have a patterning surface with high enough surface hardness and strength to achieve comparable durability to glass templates. The polymer template pattern features thus are prone to damage through successive imprinting cycles. When in use, polymer templates also typically require continued surface treatment for clean pattern separation from the cured, patterned polymeric material, as such polymer templates generally have high surface free energy and there is a tendency for polymer-to-polymer adherence which degrades template performance over successive imprint cycles.

Provided herein are polymer templates with a thin metallic or oxide layer (or layers) on the patterned surface that provides multiple benefits over current glass or fused silica templates or other polymer based templates. Also provided are methods of fabricating such templates, and template fabrications systems that incorporate such methods.

Figure 3A:
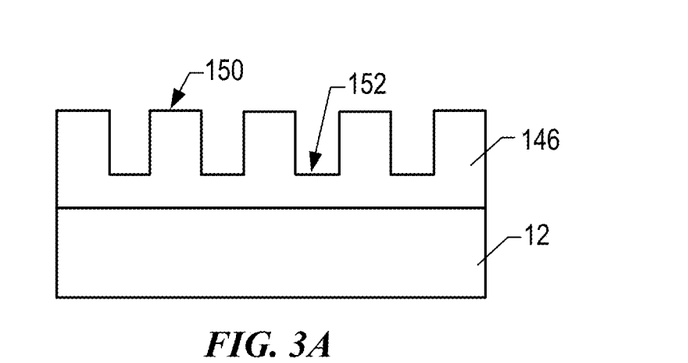
FIGS. 3A and 3B illustrate an exemplary method of forming a template according to the invention.
Figure 3B:
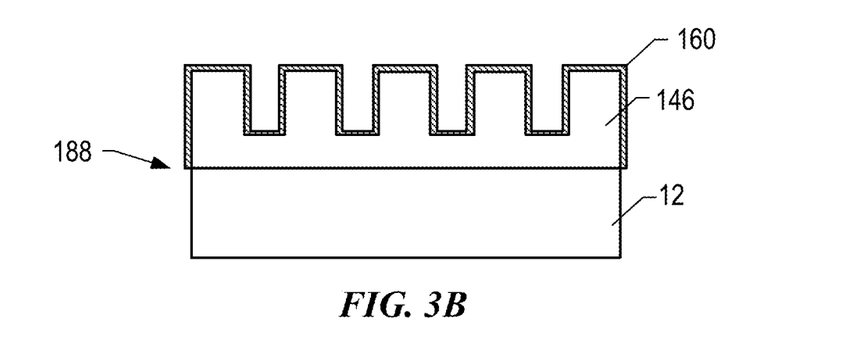
Figure 4A:
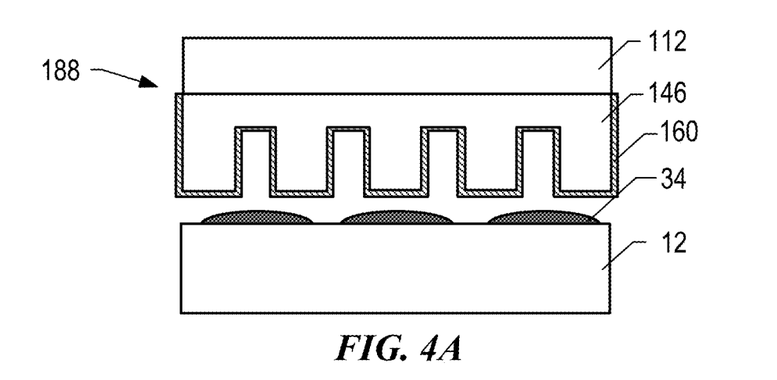
FIGS. 4A and 4B illustrate an exemplary method of imprinting a patterned layer onto a substrate using the template of FIGS. 3A and 3B.
Figure 4B:
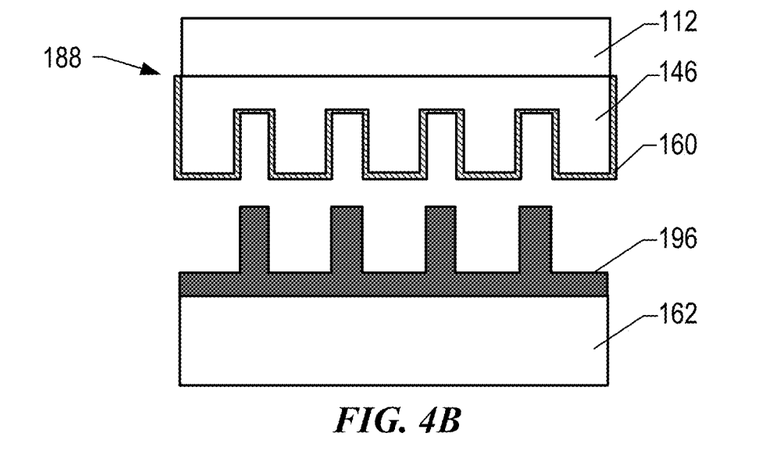

Referring to FIGS. 3A-3B, template 188 is formed of three layers: base template substrate or layer 12, patterned polymer layer 146 and thin metal or oxide layer 160 covering patterned layer 146. Base substrate 12 can be a Si or glass wafer, glass plate or a flexible film, such as a plastic film. Patterned layer 146 can be formed by UV or thermal imprint, or any other lithography processes. FIGS. 4A-4B depict, in turn, use of template 188 to imprint polymeric material 34 deposited on substrate 162 to yield patterned layer 196. The thickness of the metal or oxide layer can be in the range of 2-50 nm. In certain variations, the range can be 2-25 nm, or 2-20 nm, or 2-15 nm, or 2-10 nm.

For metal layers, the types of metal deposited on patterned layer 146 to form layer 160 can be Gold Palladium (AuPd), Silver Palladium (AgPd), Gold (Au), Silver (Ag), Platinum (Pt), or an alloy of any of these metals, or multiple layers of any of them. For AuPd and AgPd alloys in particular, the ratio of Au or Ag to Pd can range from 20:80 to 80:20. Suitable metal deposition methods include e.g. sputtering or evaporation or atomic layer deposition (ALD).

For oxide layers, the types of oxides deposited on patterned layer 146 can include e.g. silicon dioxide ($SiO_2$) or $SiO_2$-like silicon oxide layers ($SiO_x$). Suitable oxide deposition methods include e.g. sputtering or chemical vapor deposition (CVD) or ALD. As used herein chemical vapor deposition (CVD) includes plasma enhanced chemical vapor deposition (PECVD), and atmospheric pressure plasma CVD, including atmospheric pressure plasma jet (APP-Jet) and atmospheric pressure dielectric barrier discharge (AP-DBD) processes, such as those processes described in "Open Air Deposition of $SiO_2$ Films by an Atmospheric Pressure Line-Shaped Plasma," *Plasma Process. Polym.* 2005, 2, 4007-413, and "Plasma-Enhanced Chemical Vapor Deposition of $SiO_2$ Thin Films at Atmospheric Pressure by Using HMDS/Ar/$O_2$, *J. Korean Physical Society,* Vol. 53, No. 2, 2008, pp. 892896, incorporated herein by reference.

The advantages of the templates provided herein, i.e., templates having a thin layer of metal(s) or oxide(s) applied on top of a patterned polymeric layer, are manifold. First, such templates show much better fluid spreading as compared to glass or polymer templates. Without being bound by theory, it is believed that liquid imprint resist spreading and template pattern feature filling is enhanced by the hydrophilic properties of the thin metallic or oxide layer. Such enhanced resist spreading and filling properties are important in enabling high-speed imprinting processes. In particular, in UV imprinting processes using templates of the present invention, observed resist spreading was much faster than seen using a fused silica template. Further still, many UV imprint processes at the nanoscale use a helium atmosphere when imprinting in order to achieve acceptable high-throughput speeds. A helium atmosphere minimizes gas trapping that would otherwise occur in ambient air, allowing for both faster (and more faithful) feature filling times than the same process performed in ambient air. That is, helium purging may be necessary for fast and faithful template pattern filling at the nano scale imprinting level. However, helium is comparably expensive and not always readily available in general cleanroom facilities. However, given the enhanced resist spreading driven by the hydrophilic surface properties of the present inventive templates, helium-free UV imprinting is possible even at fine feature (i.e., sub-100 nm) patterning levels.

Second, during template separation the metallic or oxide layer contributes to good release performance by, among other things, blocking the liquid imprint resist from otherwise adhering to or bonding with the precured polymer pattern underneath prior to or during curing. Such polymer-polymer interactions are a disadvantage of polymer templates for the reasons previously identified. Also the thin metal or oxide layer can prolong the template useful lifetime by protecting the polymer features underneath. This is proven by pattern longevity test using sub-100 nm linewidth grating pattern. There is an optimal value in the thickness of metal coating and oxide coating for lowest separation force and to block the liquid resist from penetrating through it. When the coating thickness is too thin, separation force will be high since the imprinting layer can intermix with the underlying patterned polymer layer of the template. As the thickness increases to optimal condition, separation force will drop. As the thickness exceeds the optimal condition, separation force will be increased since the feature of the template will be stiffened and/or distorted, i.e., the separation force increases due to surface stiffening, roughening and pattern interlocking effect from mushroom-like deposition profile which likewise cases pattern profile distortion. Therefore, for a given material and pattern, a separation force test can be used to determine the optimal coating thickness for the resultant template, as further described herein.

Third, in addition to the enhanced spreading and separation performance and increased template longevity, the conductive thin metal coating is helpful in reducing or removing static charges on the template. Reduction or removal of static charges, in turn, reduces the chances of charged airborne contaminant particles being attracted to and collecting on the template surface. The presence of such particles on the template surface can otherwise cause patterning defects and/or template damage.

Fourth, the fabrication of the polymer template with metallic or oxide coating provides self linewidth modulation and/or linewidth reduction properties. For example, if the original polymeric patterns on the template consist of 50/50 nm line/space, an ~7.5 nm uniform coating of the metallic or oxide layer can change the line/space into 65/35 nm. Imprinted features using this type of template will have reverse fill factor, i.e., 35/65 nm for line/space.

Fifth, fabrication methods provided herein can reduce template replication cost and processing time. For example, the fabrication of a polymer template with metallic or oxide coating according to the invention can be performed in two simple steps; (1) imprinting (to form pattern features) and (2) deposition of the metallic or oxide layer coating material. In particular, for a polymer template with e.g. $SiO_2$-like ($SiO_x$) coating, an inline atmospheric pressure plasma CVD system or other inline atmospheric pressure deposition processes can be utilized. Such processes, which are performed under atmospheric pressure conditions, can significantly lower processing cost and greatly enhance throughput, as compared to other deposition processes which require vacuum conditions and higher temperatures. Examples of such processes are depicted in FIGS. 5A-5B.

Figure 5A:
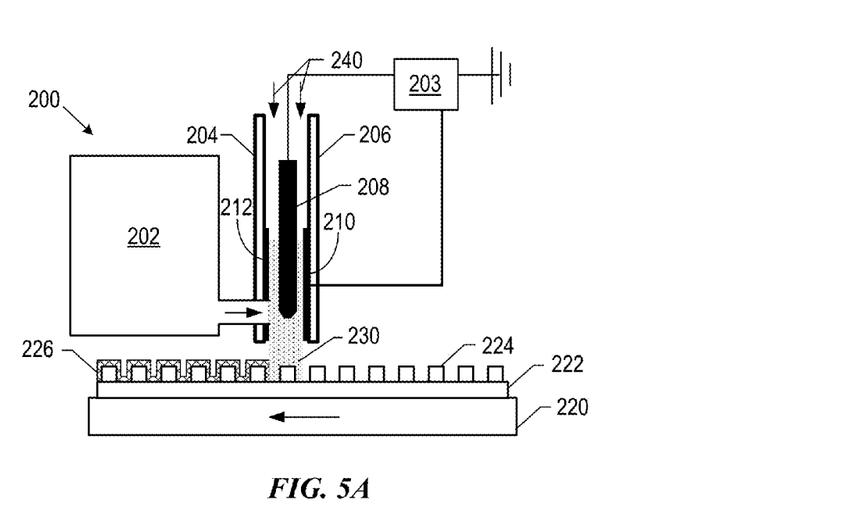
FIGS. 5A and 5B illustrate another exemplary method of forming a template according to the invention.

FIG. 5A shows an atmospheric pressure plasma jet CVD approach for depositing oxide layer 226 onto previously formed polymer pattern 224 on base layer 222. Base layer 222 is secured to motion stage 220 and translates relative to atmospheric pressure plasma jet (APPJ) system 200 which itself is oriented perpendicular to motion stage 220. APPJ system 200 consists of first and second plates or bodies 204 and 206 having first and second outer electrodes 212 and 210 disposed thereon, respectively. Inner electrode 208 is disposed between first and second electrodes 212 and 210. The electrodes are connected to voltage supply 203. Plasma gas (typically O2/Ar or He mixture) is provided through the top of the system at input 240. Precursor and carrier gas is provided near the bottom of the inner electrode 212 via supply 202. In operation, plasma/precursor mixture 230 is generated and directed downward toward patterned layer 224 where it forms oxide layer 226 on patterned layer 224 as it is translated relative to system 200.

Figure 5B:
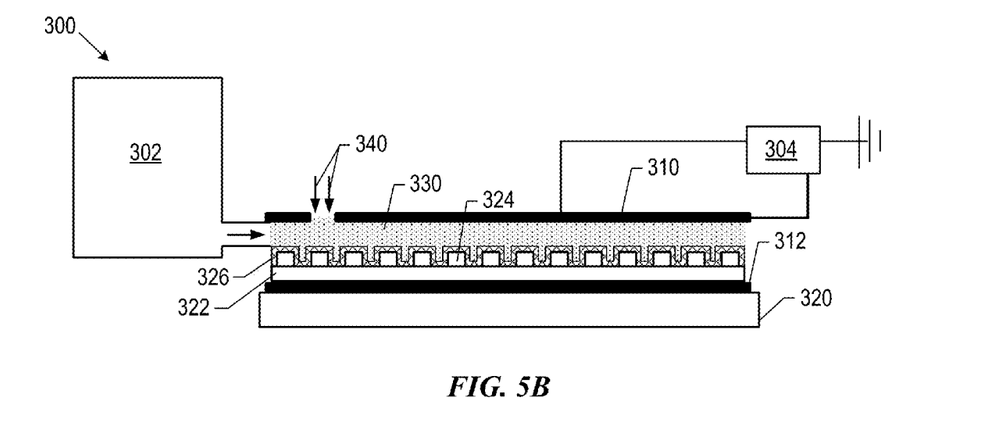

FIG. 5B shows a similar approach using atmospheric pressure plasma dielectric barrier discharge system (DBD) system 300. Here, first and second electrodes 310 and 312 are connected to voltage supply 304 and otherwise disposed in parallel with base layer 322 and patterned polymer layer 326, with first electrode 310 positioned above patterned polymer layer 326 and second electrode 312 positioned between motion stage 320 and base layer 322. Plasma gas ($O_2$/Ar or He mixture) and precursor and carrier gases are provided through input 340 and supply 302, respectively. In this approach, the template may remain static during oxide layer 326 formation from generated plasma/precursor mixture 330.

Figure 6A:
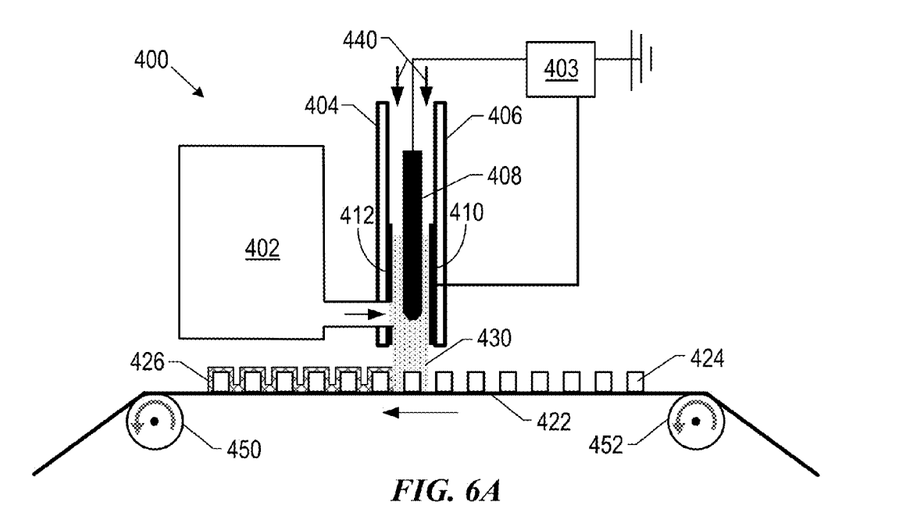
FIGS. 6A and 6B illustrate yet another exemplary method of forming a template according to the invention.
Figure 6B:
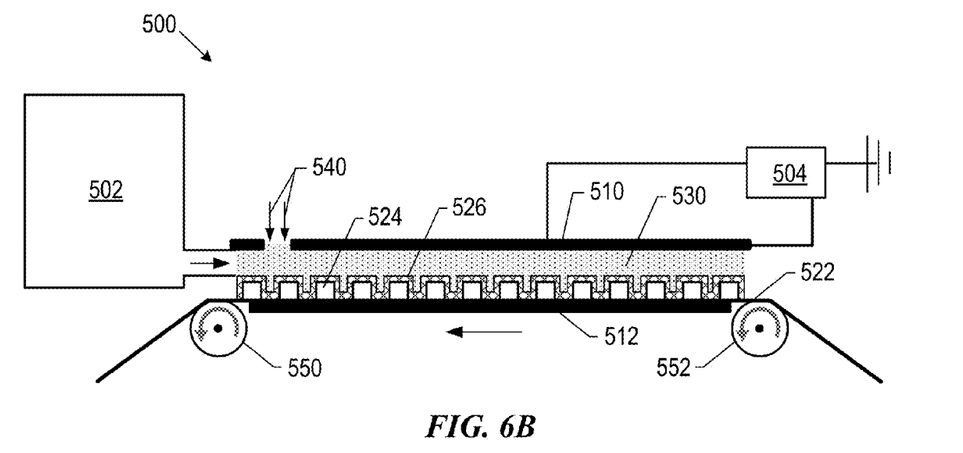

In addition, continuous roll-to-roll methods for translating a flexible plastic substrate having prepatterned features can also be used for forming templates according to the invention, leading to additional cost savings. Examples of such processes are depicted in FIGS. 6A and 6B, which illustrate the atmospheric pressure plasma jet CVD system and atmospheric pressure plasma dielectric barrier discharge system (DBD) of FIGS. 5A-5B, respectively, adapted for oxide deposition onto a polymer template formed on a flexible film substrate, such as a polycarbonate (PC) film. The flexible substrates can be retained and translated relative to the APPJ and APP-DBD systems using e.g. roll-to-roll systems such as described in U.S. Patent Publication No. 2013-0214452, incorporated herein by reference in its entirety.

Turning to FIG. 6A, flexible film substrate (or base layer) 422 is supported by rollers 450 and 452 which operate under tension to retain the substrate in a flat configuration and which, when rotated, can translate substrate 422 relative to atmospheric pressure plasma jet (APPJ) system 400. APPJ system 400 is configured as otherwise described above with respect to FIG. 5A (i.e., with voltage source 403 connected to outer electrodes 410 and 412 positioned on opposing plates 406 and 404 and with inner electrode 408 disposed in between, together with plasma gas input 440 and precursor and carrier gas supply 402, and operating such that generated plasma/precursor mixture 430 is directed downward and deposited onto patterned polymer layer 424, thereby forming oxide layer 426). With reference to FIG. 6B, rollers 550 and 552 likewise support and retain flexible film substrate (or base layer) 522 and operates as described above with respect to the roller system of FIG. 6A such substrate 522 is translated relative to APP-DBD system 500. APP-DBD system 500 is configured as otherwise described above with respect to FIG. 5B (i.e., with voltage source 504 connected to opposing parallel electrodes 510 and 512 with electrode 510 positioned above patterned polymer layer 524 and electrode 512 positioned below substrate 522, together with plasma gas input 540 and precursor and carrier gas supply 502, and operating such that generated plasma/precursor mixture 530 deposits onto patterned polymer layer 524, thereby forming oxide layer 526).

Figure 7:
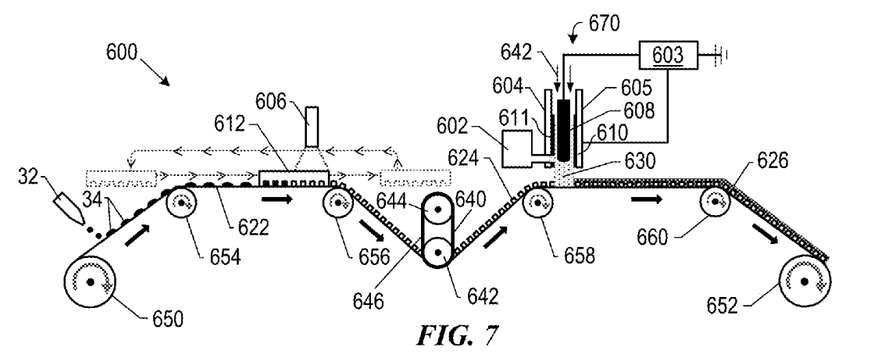
FIG. 7 illustrates a further exemplary method of forming a template according to the invention.

Further still, such atmospheric pressure processes as described with respect to FIGS. 6A and 6B can be combined with imprint lithography patterning techniques (also done at atmospheric pressure) such that patterning of the precursor substrate (e.g., glass or plastic film) can be directly followed by oxide coating of the patterned layer, thereby providing for continuous, in-line processes for fabricating such templates. An example of such a process is depicted in FIG. 7 which depicts imprinting of a flexible substrate with to form a polymeric template immediately followed by metal or oxide layer deposition via atmospheric pressure plasma jet (APPJ) system similar to that of FIG. 6A. More particularly, system 600 includes rollers 650 and 652 under tension with additional support rollers 654, 656, 658, and 660 which collectively operate to support and retain flexible film substrate 622 in a flat configuration and translate the substrate across a series of positions. In the imprinting step, substrate 622 is translated from a first position to a second position during which fluid dispense system 32 deposits droplets of polymerizable material 34 onto substrate 622 while master template 612 (connected to a template chuck on a motion stage not shown) is moved into superimposition with and co-translates with substrate 622 such that polymerizable material fills the relief pattern of master template 612. Energy source 606 provides actinic energy to cure polymerizable material 34 and form patterned polymer layer 624 during such cotranslation. Master template 612 is then separated from formed layer 624 and returned to its initial position. Substrate 622 is then fed from the second position to a third position. Roller belt system 640, comprising rollers 642 and 644, is provided to maintain tension on substrate 622 during such movement, with belt system 646 further having protective film 646 that protects features of patterned polymer layer 624 from damage as it translates around roller 642. Substrate 622 containing patterned polymer layer 624 is then translated from the third to fourth position and in the process passes beneath APPJ system 670 which essentially operates as system 400 described above with respect to FIG. 6A to deposit oxide layer 626 onto patterned polymer layer 624 (i.e., voltage source 603 is connected to outer electrodes 610 and 611 positioned on opposing plates 605 and 604 and with inner electrode 608 disposed in between, together with plasma gas input 642 and precursor and carrier gas supply 602, and operating such that generated plasma/precursor mixture 630 is directed downward and deposited onto patterned polymer layer 624, thereby forming oxide layer 626 on patterned polymer layer 624 as substrate 622 is translated past APPJ system 670).

EXAMPLES

Metal-Coated Polymer Templates

Example 1: Metal Layer Thickness Determination

Figure 8:
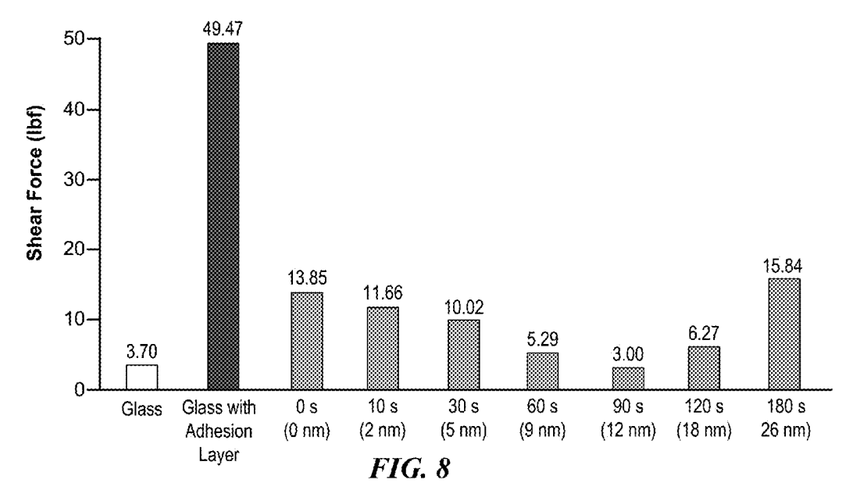
FIG. 8 depicts shear force experimental results of templates according to the invention.

Shear force testing was used to determine optimal coating thicknesses for various AuPd coating thicknesses. Silicon wafer substrates were coated with an adhesion layer, with a UV curable imprint resist fluid (MonoMat™, Molecular Imprints, Austin, Tex.) in turned deposited via small droplets onto the adhesion layer and then imprinted with a blank imprint template and cured to form a flat polymeric layer. AuPd (60%/40%) was sputtered onto the polymeric layer using an Edwards S150B Sputter Coater (Edwards Ltd., West Sussex, UK) at various sputtering times ranging from 0-180 seconds, resulting in corresponding AuPd layer thicknesses as follows: 0 sec (0 nm); 10 sec (2 nm); 30 sec (5 nm); 60 sec (9 nm); 90 sec (12 nm); 120 sec (18 nm); 180 sec (26 nm). Shear force tests were performed with each AuPd coated sample using an Instron Model 5524 force tester (Instron, Norwood, Mass.). The same UV curable imprint resist was deposited onto each AuPd coated sample, then placed in contact with the test specimen of the force tester (which itself was treated the same adhesion layer as above), followed by curing of the imprint resist. Each sample was then subjected to shear force testing with the results shown in the graph of FIG. 8. Glass test specimens (with and without an adhesion layer) were also tested as controls. As observed, shear force decreased at longer sputtering times up to a 90 second sputter time, which corresponds to a 10-15 nm AuPd layer. This sample had the lowest shear force (at 3.00 lbf), and corresponds to the lowest anticipated separation force in use. However, longer sputtering times beyond 90 seconds caused an increase shear (and thus separation force), likely due to increased sputtering time resulting in surface roughening of the AuPd layer, which can increase total surface contact area with the cured resist, thereby increasing in turn the adhesion force that must be overcome.

Example 2: Template Formation

Metal coated polymer templates with 130 nm pitch gratings (65 nm line width; 65 nm space width) were prepared as follows. A silicon master template having 130 nm pitch gratings as above was loaded onto a roll-to-roll imprinting tool (LithoFlex™ 100, Molecular Imprints, Austin, Tex.) and then the pattern was transferred to 170 um thick polycarbonate film by drop deposition of the UV curable imprint resist fluid as in Example 1 above onto the polycarbonate film followed by imprinting with the silicon master template to form patterned polymeric layers on the polycarbonate film having same dimensions (i.e., 130 nm pitch gratings with 65 nm line width and 65 nm space width). These patterned polymer layers were then subjected to AuPd or AgPd sputtering as described in Example 1 above, each for approximately 90 seconds sputtering (12 nm target thickness) to form AuPd or AgPd coated polymer templates at the following ratios: AuPd (75:25), AgPd (60:40) and AgPd at 30:70.

Example 3: Patterning Performance

The templates of Example 2 were subjected to imprint testing as follows. Imprint resist fluid as above was drop-dispensed onto adhesion layer treated silicon wafers and imprinted using the AuPd and AgPd polymer templates of Example 2. Imprinting was performed by hand rolling under atmospheric pressure conditions. Once cured, template separation was also done by a manual peel-off method. The resultant imprinted patterned layers on the silicon wafers were evaluated for visible defects, including global or local separation failure and/or feature shearing, breaking or distortion. Each template exhibited good pattern transfer without showing any local or global separation failure, or feature shearing, breakage or distortion.

Example 4: Separation Force

Figure 9:
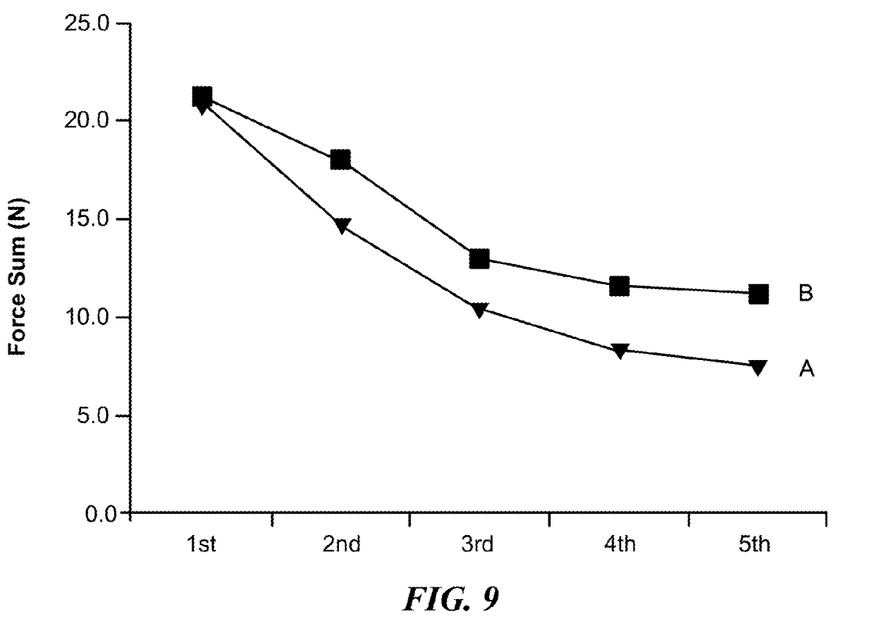
FIG. 9 depicts separation force experimental results of a template according to the invention.

An AuPd (60%/40%) coated polymer template was prepared as in Example 2 above but with a 60 nm half-pitch (60 nm line width, 60 nm space width) concentric gratings pattern. The template was sputtered for approximately 90 seconds to form an approximately 12 nm layer. This template was subjected to multiple imprint testing, as described in Example 3, and the separation force observed was compared to the separation force observed when using a standard fused silica template of the same pattern dimensions. The results are depicted in FIG. 9 (with data from the standard fused silica template identified by reference letter "A"; and data from the AuPd polymer template identified by reference letter "B"). Both templates exhibited a lowering of separation force over successive imprints (from initial separation force at about 20 N down to levels of 10N or less after the 5$^{th}$ successive imprint), with the sample template similar in overall separation performance as compared to the fused silica template.

Example 5: Fluid Filling

Figure 10:
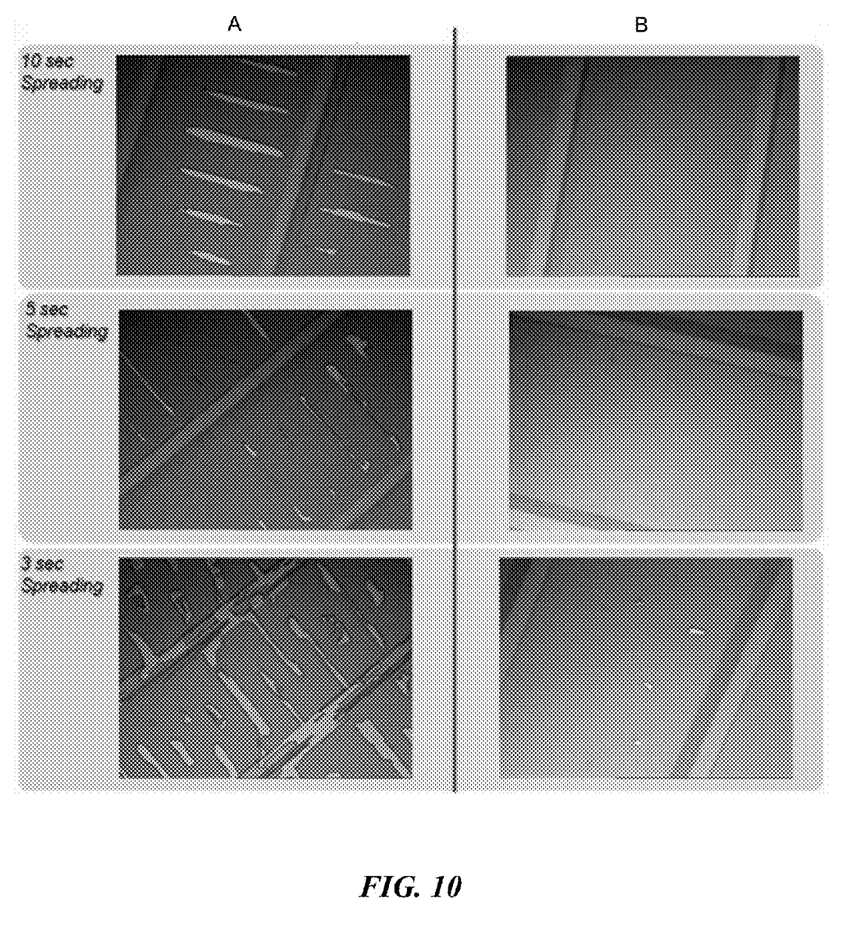
FIG. 10 depicts fluid filling experimental results of a template according to the invention.

The template of Example 4 above was subjected to machine imprint testing using HD700 imprint lithography tool (Molecular Imprints, Austin, Tex.) Fluid spread and fill times were monitored during imprinting. For each template, images were obtained of fluid spreading and filling at 3 seconds, 5 seconds, and 10 seconds, and these images were compared against those obtained using the standard fused silica template of the same pattern dimensions under identical conditions. These images are depicted at FIG. 10, with column "A" images corresponding to the fused silica template and the column "B" images corresponding to the Example 3 template. As can be observed, the Example 3 template provides enhanced fluid spreading and filling as compared to the fused silica template. The Example 3 template showed complete spreading and filling within 5 seconds, whereas the fused silica template still had not completely spread and filled by 10 seconds.

Example 6: Template Longevity

The template of Example 3 was subjected to 100× continuous imprint testing according to the procedures described in Example 3. After the 100$^{th}$ imprint there was still no imprint pattern degradation or any indication of global or local separation failure.

Oxide Coated Polymer Templates

Example 7: Template Formation (Vacuum Deposition) and Patterning Performance

Oxide-coated polymer templates were prepared as otherwise described above in Example 2 but with silicon dioxide (SiO$_2$) substituted for AuPd or AgPd and deposited by PECVD. A PTI-790 deposition system (Plasma-Therm, St. Petersburg, Fla.) was used to deposit SiO$_2$ in various thicknesses onto the pre-patterned film to form SiO$_2$-coated polymer templates. Templates were formed having SiO$_2$ layer thicknesses of 10 nm and 15 nm as measured along the top of the gratings (with sidewall SiO$_2$ thicknesses correspondingly reduced to 2.5 nm and 5 nm, respectively). These SiO$_2$-coated polymer templates were subjected to imprint testing as described in Example 3, and likewise each template exhibited good pattern transfer without showing any local or global separation failure, or feature shearing, breakage or distortion.

Example 8: Template Blending

The 15 nm SiO$_2$ coated polymer template of Example 8 was subjected to repeated bending to replicate use conditions associated with roll-to-roll imprinting. Specifically, the template (80 mm by 80 mm) was bent into a curve having an approximately 5 mm radius then allowed to return to its normal configuration. This process was repeated 20 times and the template was inspected by SEM. No surface cracking or other damage was observed.

Example 9: UV Transmission

SiO$_2$ templates prepared according to Example 7 above were tested for UV and visible light transmission. These templates had SiO$_2$ layer thicknesses of 10 nm, 16 nm, and 23 nm, respectively. Also tested for comparison were AuPd and AgPd templates formed according to Example 2 above, as well as bare polycarbonate film. Air was used as reference. The 10 nm, 18 nm and 23 nm SiO$_2$ coating showed essentially the same UV transmission (75-76%) as bare PC film at A=365 nm. The AuPd and AgPd coated templates, by contrast, had transmission levels of 41% and 44% respectively, about a 45% loss relative to the SiO$_2$ coated templates.

Example 10: Template Formation (Atmospheric Pressure Plasma Jet Process, APPJ)

SiO$_2$-like material (SiO$_x$) coated polymer templates using atmospheric pressure plasma jet (APPJ) were formed as follows. The initial patterned film was formed as described in Example 2. These pre-patterned polycarbonate film were then subject to APPJ deposition system (Surfx Technologies, Redondo Beach, Calif.) to coat SiO$_x$ material in various thicknesses (5 nm, 10 nm, 23 nm, 33 nm and 43 nm). Tetramethylcyclotetrasiloxane (TMCTS) precursor mixed with helium dilution gas and oxygen reacting gas was used. APPJ deposition head fixed on x-y stage was moved over the pre-patterned film surface with 10 mm gap at ambient environment to form the SiOx-coated polymer templates.

Example 11: Patterning Performance

SiO$_x$-coated polymer templates prepared according to Example 10 were subjected to imprint testing as described in Examples 3 and 7. Each template exhibited good pattern transfer without showing any local or global separation failure, or feature shearing, breakage or distortion.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A system for forming an imprint lithography template comprising:
 (a) a substrate support system configured to retain a flexible film substrate in a flat configuration and subsequently translate such retained flexible film substrate from a first position to a second position and from a third position to a fourth position;

(b) a fluid dispense system positioned proximate to the first position, the fluid dispense system configured to dispense polymerizable material onto the retained flexible substrate;

(c) a motion stage having a template chuck, the template chuck configured to retain a master template, the motion stage moveable between the first and second positions and further configured to translate a master template retained by the template chuck into superimposition with the retained flexible film substrate as the retained flexible film is translated from the first position to the second position;

(d) an imprint head configured to vary a distance between the master template and the retained flexible film substrate to define a volume therebetween that is filled by the polymerizable material;

(e) an energy source configured to provide curing energy to solidify the polymerizable material when the polymerizable material fills the volume between the master template and the retained flexible film substrate to define a patterned layer; and (f) an atmospheric pressure plasma chemical vapor deposition (AP-CVD) system located between the third and fourth positions, the AP-CVD system including a power control unit, a plasma generation unit including opposing electrodes connected to the power control unit, the electrodes positioned in parallel with the substrate along a first direction, the AP-CVD configured to generate and deposit an oxide layer having a particular thickness onto the patterned layer as the retained flexible film substrate is translated from the third position to the fourth position, the retained flexible film substrate positioned between the opposing electrodes, the particular thickness of the oxide layer based on i) a type of material of the oxide layer and ii) a pattern of the patterned layer.

2. The system of claim 1 wherein the AP-CVD system further comprises an atmospheric pressure plasma dielectric barrier discharge (APDBD) system.

\* \* \* \* \*

UNITED STATES PATENT AND TRADEMARK OFFICE
CERTIFICATE OF CORRECTION

PATENT NO. : 9,816,186 B2  
APPLICATION NO. : 14/922953  
DATED : November 14, 2017  
INVENTOR(S) : Se-Hyun Ahn, Byung-Jin Choi and Frank Y. Xu Page 1 of 1

It is certified that error appears in the above-identified patent and that said Letters Patent is hereby corrected as shown below:

On the Title Page

Related U.S. Application Data  
Item (63)  
Please delete "Continuation" and substitute -- Division --.

Signed and Sealed this  
First Day of September, 2020

Andrei Iancu  
*Director of the United States Patent and Trademark Office*